US006794101B2

(12) United States Patent
Liu et al.

(10) Patent No.: US 6,794,101 B2
(45) Date of Patent: Sep. 21, 2004

(54) MICRO-ELECTRO-MECHANICAL DEVICE AND METHOD OF MAKING

(75) Inventors: Lianjun Liu, Gilbert, AZ (US); Jenn-Hwa Huang, Hsin-Chu (TW); Lei Mercado, Gilbert, AZ (US); Shun-Meen Kuo, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 7 days.

(21) Appl. No.: 10/159,909

(22) Filed: May 31, 2002

(65) Prior Publication Data

US 2003/0224267 A1 Dec. 4, 2003

(51) Int. Cl.[7] ......................... G03G 13/04; H01L 21/00
(52) U.S. Cl. .............................. 430/48; 438/50; 438/52
(58) Field of Search ............................... 430/48, 50, 52

(56) References Cited

U.S. PATENT DOCUMENTS 5,578,976 A 11/1996 Yao
6,046,659 A * 4/2000 Loo et al. .................... 333/262
6,100,477 A 8/2000 Randall et al.
6,310,339 B1 * 10/2001 Hsu et al. ................ 250/214.1
6,396,368 B1 * 5/2002 Chow et al. ................ 333/262
6,483,056 B2 * 11/2002 Hyman et al. .............. 200/181

OTHER PUBLICATIONS

D. Hyman & M. Mehregany, "Contact Physics of Gold Microcontacts for MEMS Switches," *IEEE: Transactions on Components and Packaging Technology*, Sep. 1999, pp. 357–364.

P. Zavracky, et al., "Micromechanical Switches Fabricated Using Nickel Surface Micromachining," *IEEE: Journal of Microelectromechanical Systems*, Mar., 1997, pp. 3–9.

J. Yao, et al., "A Surface Micromachined Miniature Switch for Telecommunications Applications with Signal Frequencies from DC Up to 4GHZ," *Transducers '95—Eurosensors IX*, Jun. 25–29, 1995, pp. 384–387.

* cited by examiner

*Primary Examiner*—Alexander Ghyka
(74) *Attorney, Agent, or Firm*—Bryan Cave LLP

(57) ABSTRACT

A micro-electro-mechanical device (10) including a shorting bar (40) having a first portion (42) electrically coupled to a first input/output signal line (34) and a second portion (43) electrically uncoupled to a second input/output signal line (36). Shorting bar (40) is coupled to a moveable end (49) of a cantilever structure (44). Thus, preferably only the second portion (43) of shorting bar (40) needs to be actuated to be electrically coupled to the second input/output signal line (36).

13 Claims, 3 Drawing Sheets

MICRO-ELECTRO-MECHANICAL DEVICE AND METHOD OF MAKING

FIELD OF THE INVENTION

This invention relates to electronics, in general, and to micro-electro-mechanical devices and methods of making, in particular.

BACKGROUND OF THE INVENTION

Micro-electro-mechanical devices are used for a wide range of applications. These devices or micro-switches have the advantage of providing superior switching characteristics over a wide range of frequencies. One type of micro-electro-mechanical switch structure utilizes a cantilever beam design. A cantilever beam with contact metal thereon rests above an input signal line and an output signal line. During switch operation, the beam is electro-statically actuated by applying voltage to an electrode on the cantilever beam. Electrostatic force pulls the cantilever beam toward the input signal line and the output signal line, thus creating a conduction path between the input line and the output line through the metal contact on the cantilever beam.

One disadvantage of this design is the high contact resistance of the shorting bar, which must make contact to two places, the input signal line and the output signal line. High contact resistance results in higher radio frequency (RF) power insertion loss through the signal path.

Accordingly, a need exists for a micro-electro-mechanical device with reliable mechanical and electrical contact characteristics having low contact resistance. A need also exists for a method of making the micro-electro-mechanical device.

BRIEF DESCRIPTION OF THE DRAWINGS

The invention will be better understood from a reading of the following detailed description, taken in conjunction with the accompanying figures in the drawings in which.

Figure 2:
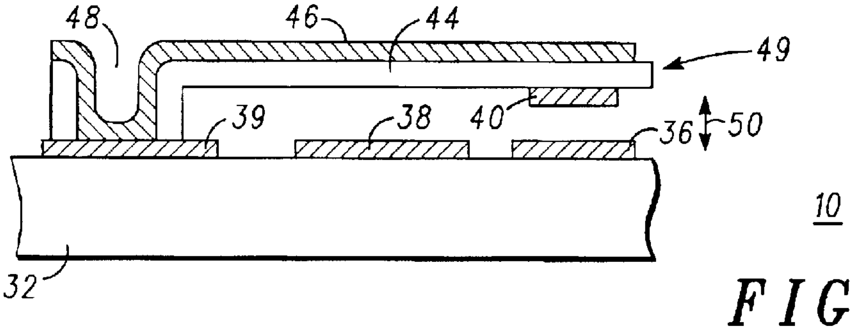
FIG. 2 illustrates a cross-sectional view of the micro-electro-mechanical device of FIG. 1, taken along a cross-sectional line 2—2 in FIG. 1.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale. For example, the dimensions of some of the elements in the figures may be exaggerated relative to other elements to help to improve understanding of embodiments of the present invention. Furthermore, the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances such that the embodiments of the invention described herein are, for example, capable of operation in other sequences than illustrated or otherwise described herein.

Moreover, the terms left, right, front, back, top, bottom, over, under, and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than illustrated or otherwise described herein.

DETAILED DESCRIPTION OF THE DRAWINGS

The present invention relates to structures and methods for forming a micro-electro-mechanical device. More particularly, the micro-electro-mechanical device described herein utilizes an electrically coupled or fixed portion and an electrically uncoupled or moveable portion of a shorting bar so that when a cantilever structure or beam is actuated, preferably only one portion of the shorting bar, i.e., the uncoupled or movable portion, needs to make electrical contact to one of the input/output signal lines. The electrically coupled or fixed portion of the shorting bar is fabricated so that it is electrically coupled to one of the input/output signal lines preferably at all times, not just during actuation of the cantilever structure.

Figure 3:
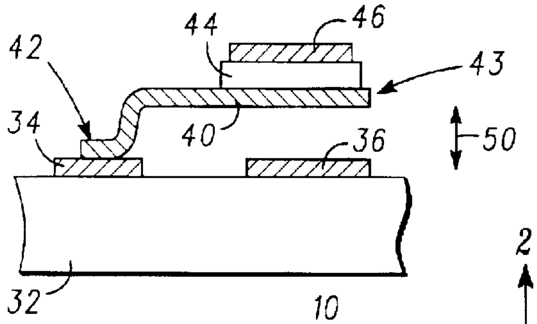
FIG. 3 illustrates a cross-sectional view of the micro-electro-mechanical device of FIG. 1, taken along a cross-sectional line 3—3 in FIG. 1.
Figure 1:
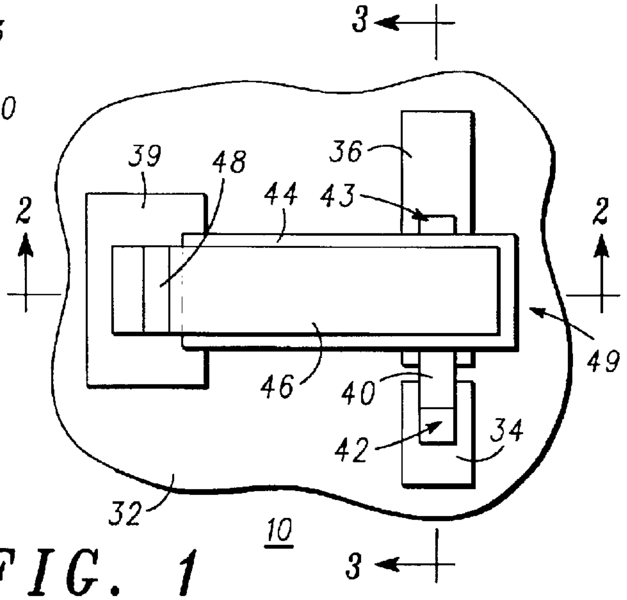
FIG. 1 illustrates a simplified top view of a micro-electro-mechanical device according to a first embodiment of the present invention.

Turning now to FIGS. 1, 2, and 3, a micro-electro-mechanical device 10 is illustrated according to an embodiment of the present invention. FIG. 1 illustrates a simplified top view of a micro-electro-mechanical device 10; FIG. 2 illustrates a cross-sectional view of micro-electro-mechanical device 10, taken along a cross-sectional line 2—2 in FIG. 1, and FIG. 3 illustrates a cross-sectional view of micro-electro-mechanical device 10, taken along a cross-sectional line 3—3 in FIG. 1. A substrate 32 provides structural or mechanical support. Preferably, substrate 32 is comprised of material, such as a high resistivity silicon (Si), gallium arsenide (GaAs), or glass, that does not allow any RF losses. Other materials may also be suitable.

A first electrically conductive layer or first input/output signal line 34 (FIGS. 1 and 3) and a second electrically conductive layer or second input/output signal line 36, a ground electrode 38 (FIG. 2), and a top contact 39 (FIGS. 1 and 3) are formed over substrate 32. First input/output signal line 34 is physically separated from second input/output signal line 36, as shown in FIG. 1.

Preferably, first input/output signal line 34, second input/output signal line 36, ground electrode 38, and top contact 39 for top electrode 46 are formed of the same material(s) and at the same time. These contact layers or electrodes can be formed by lift off techniques, by electroplating, or by first forming and then patterning a metal layer or metal layers over substrate 32. A lift-off process is preferred if the metal materials used are difficult to pattern using etching techniques. The methods of forming the first input/output signal line 34, second input/output signal line 36, ground electrode 38, and top contact 39 are well known in the art.

First input/output signal line 34, second input/output signal line 36, ground electrode 38, and top contact 39 are preferably comprised of (1) a conductive layer that is comprised of a non-oxidizing metal or (2) metal layers, such as, for example, chrome and gold (with chrome being deposited first). If chrome and gold are used, a suitable thickness of chrome is 10–30 nanometers and of gold is 0.5–3 micrometers.

A cantilever structure 44 is formed overlying substrate 32 and anchored to substrate 32 at a first or anchored end 48 over top contact 39. Anchored end 48 is fixed to and immovable relative to first input/output signal line 34. Cantilever structure 44 also has a second or moveable end 49 suspended over substrate 32. Moveable end 49 of cantilever structure 44 is moveable in the direction of arrow 50 (FIGS. 2 and 3) and relative to second input/output signal line 36 and substrate 32.

A shorting bar 40 is coupled to the bottom of movable end 49 of cantilever structure 44. A first or electrically coupled portion 42 of shorting bar 40 is electrically coupled, preferably permanently, to first input/output signal line 34 (see FIG. 2). A second or electrically uncoupled portion 43 of shorting bar 40 is suspended over and overlies second input/output signal line 36. This single contact design is configured so that preferably only the electrically uncoupled portion 43 of shorting bar 40 must be actuated to make electrical contact to second input/output signal line 36. This single-point, electrical coupling method provides lower total contact resistance than the dual-point electrical coupling method of the prior art.

In FIGS. 1, 2, and 3 one can see that shorting bar 40 bridges over at least a portion of second input/output signal line 36 and that the electrically coupled portion 42 of shorting bar 40 is permanently electrically coupled to first input/output signal line 34. A top electrode 46 is formed over the top of cantilever structure 44. Top electrode 46 is electrically coupled to top contact 39. Shorting bar 40 also extends, from electrically coupled portion 42 to electrically uncoupled portion 43, in a direction approximately 90 degrees from the direction of cantilever structure 44.

In a preferred embodiment, electrically coupled portion 42 is also physically directly coupled or connected to first input/output signal line 34. Note that ground electrode 38 is not shown in FIG. 1 (nor will it be shown in the later drawing figures showing a top view) in order to simplify the illustration.

FIG. 3 readily shows the electrically coupled portion 42, which is preferably permanently electrically coupled to first input/output signal line 34, and the electrically uncoupled portion 43, which is overlying, but not electrically coupled to, second input/output signal line 36 when cantilever structure 44 has not been actuated. In this embodiment, electrically coupled portion 42 can also be referred to as a fixed portion, and electrically uncoupled portion 43 can also be referred to as a moveable portion.

Electrically uncoupled portion 43 of shorting bar 40 is electrically coupled to second input/output signal line 36 when cantilever structure 44 has been actuated. This actuation preferably only occurs during operation of micro-electro-mechanical device 10. Cantilever structure 44 is actuated when an electrostatic charge between top electrode 46 and ground electrode 38 pulls the cantilever structure 44 toward ground electrode 38, thus making the second or electrically uncoupled portion 43 of shorting bar 40 be electrically coupled to second input/output signal line 36. The electrostatic charge is formed when a voltage is applied between top electrode 46 and ground electrode 38.

Still referring to FIGS. 1, 2, and 3, the process of forming cantilever structure 44, shorting bar 40, and top electrode 46 is described briefly below. Cantilever structure 44, shorting bar 40, and top electrode 46 are suspended over substrate 32 by first forming a sacrificial layer (not shown) over substrate 32. The formation of a sacrificial layer is well known in the art, and thus is not described herein.

Shorting bar 40 is formed over the sacrificial layer overlying input/output signal lines 34 and 36. Shorting bar 40 is preferably formed using lift-off techniques. Lift-off techniques are well known in the art, and thus this step is not described further. Shorting bar 40 should be comprised of an electrically conductive layer or metal that is compatible with first input/output signal line 34 and second input/output signal line 36. In a preferred embodiment, shorting bar 40 is comprised of a layer of gold and a layer of chrome. Gold is formed first so that the gold of shorting bar 40 is in contact with the gold of first input/output signal line 34 and second input/output signal line 36 when cantilever structure 44 is actuated or closed during switch operation. A suitable amount of gold is approximately 400–2,000 nanometers, and a suitable amount of chrome is approximately 15–25 nanometers. Other thicknesses, however, may be acceptable.

Subsequent to the formation of shorting bar 40 and before removal of the sacrificial layer (not shown), the cantilever structure 44 is formed over substrate 32 and overlying shorting bar 40. An opening (not shown) leading to top contact 39 is made in the sacrificial layer (not shown) that is subsequently removed so that cantilever structure 44 can be anchored to it. Cantilever structure 44 is preferably comprised of silicon dioxide, silicon oxynitride, or silicon nitride, but other dielectrics may be used as well, including a composite layer of different dielectrics. The thickness of cantilever structure 44 is in the range of approximately 1–3 micrometers and preferably formed by Pressure Enhanced Chemical Vapor Deposition (PECVD) to produce a low stress dielectric layer.

Top electrode 46 is then formed over cantilever structure 44 and over top contact 39. Top electrode 46 is preferably comprised of titanium and gold. For example, 15–25 nanometers of titanium and 100–300 nanometers of gold may be formed. Top electrode 46 is preferably formed by using photoresist lift-off techniques.

Top electrode 46 and cantilever structure 44 are defined; then the sacrificial layer is removed from underneath electrically uncoupled portion 43 of shorting bar 40, cantilever structure 44, and top electrode 46 so that electrically uncoupled portion 43, cantilever structure 44, and top electrode 46 are released and are able to move in the direction shown by arrow 50 in FIGS. 2 and 3.

Micro-electro-mechanical device 10 has improved manufacturability and reliability and reduced contact resistance. When cantilever structure 44 is actuated, the contact resistance between the first or electrically coupled portion 42 and first input/output signal line 34 is lower than the contact resistance between the second or electrically uncoupled portion 43 and second input/output signal line 36. The reason that the contact resistance between the first or electrically coupled portion 42 and first input/output signal line 34 is lower is because electrically coupled portion 42 is fixedly or permanently electrically coupled or contacted to first input/output signal line 34. Thus, micro-electro-mechanical device 10 has lower contact resistance overall, which improves the operating characteristics. Manufacturability is improved because the design of a single contact is less complicated than a dual contact design of the prior art (described below).

Figure 4:
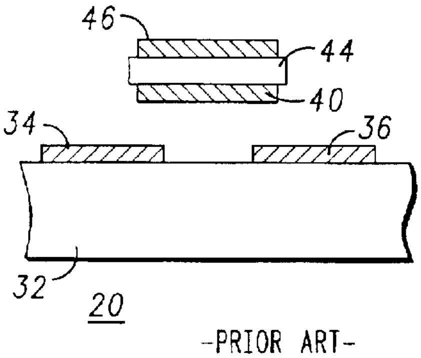
FIG. 4 illustrates a cross-sectional view of a prior art device.

FIG. 4 illustrates a prior art structure shown in the same view as FIG. 3. The same reference numbers are used for similar elements despite their potentially dissimilar configuration, in order to ease the understanding of the differences between micro-electro-mechanical device 10 and the prior art. In the prior art, shorting bar 40 does not have an electrically coupled portion 42 in combination with an electrically uncoupled portion 43. In the illustrated prior art, no portion of shorting bar 40 is electrically coupled to either of first and second input/output signal lines 34 and 36 until the cantilever structure 44 is actuated.

Figure 5:
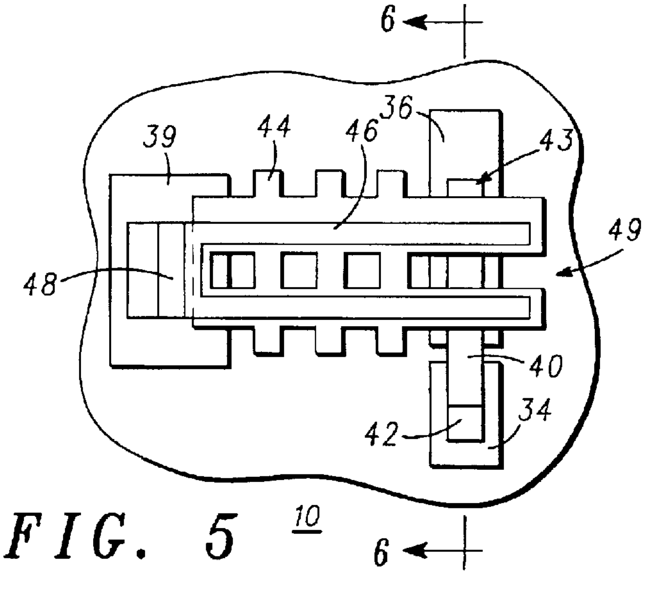
FIG. 5 illustrates a simplified top view of a micro-electro-mechanical device according to a second embodiment of the present invention.
Figure 6:
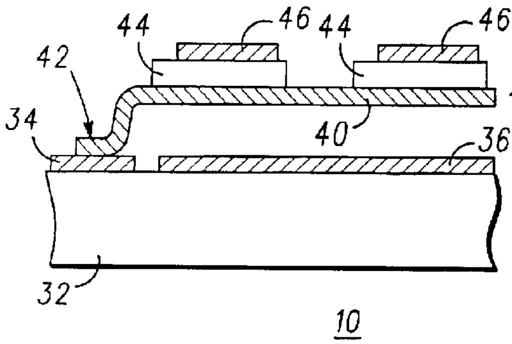
FIG. 6 illustrates a cross-sectional view of the micro-electro-mechanical device of FIG. 5, taken along a cross-sectional line 6—6 in FIG. 5.
Figure 7:
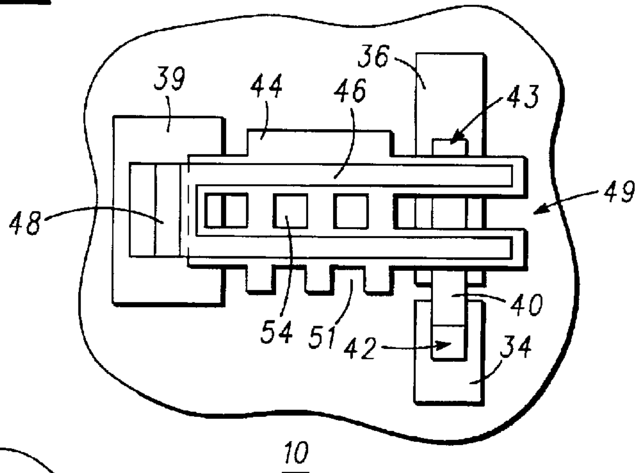
FIG. 7 illustrates a simplified top view of a micro-electro-mechanical device according to a third embodiment of the present invention.

FIG. 5 shows a simplified top view of a second embodiment of the present invention, which illustrates a cantilever structure 44 having a two finger pattern. FIG. 6 illustrates a cross-sectional view of the device in FIG. 5, taken along a cross-sectional line 6—6 in FIG. 5. For ease of understanding, the same numerals are used for similar elements, despite their potentially dissimilar configurations. The two finger pattern allows for the ability to make one of the fingers, or the finger on the side of the electrically uncoupled portion 43 of shorting bar 40, wider (or otherwise having more mass) than the other finger, or the finger on the side of the electrically coupled portion 42 of shorting bar 40. Although not illustrated herein, more than two fingers may be formed if desired. With more mass, less electrostatic force is needed to pull the electrically uncoupled portion 43 of shorting bar 40 toward second input/output signal line 36. FIG. 7 illustrates a third embodiment of the present invention, wherein another design of cantilever structure 44 has a two finger pattern and also provides for more mass on the side of the electrically uncoupled portion 43 of shorting bar 40 is illustrated. The overall objective is to get more mass on one side, and the openings 51 and 54 represent one technique for achieving that. For ease of understanding, the same numerals are used for similar elements, despite their potentially dissimilar configurations. In this embodiment, cantilever structure 44 has more openings 51 on the side of the electrically coupled portion 42 of shorting bar 40. Only two variations have been shown herein, but many different patterns of cantilever structure 44 are available to meet the goal of providing more mass on the side of the electrically uncoupled portion 43 of shorting bar 40. Having more mass in cantilever structure 44 on the side of the electrically uncoupled portion 43 of shorting bar 40 may provide for higher rigidity, thus higher resistance to deformation of that portion 43 of shorting bar 40, so that portion 43 of shorting bar 40 preferably only bends as needed to make electrical contact with second input/output signal line 36. The higher rigidity compensates for the non-symmetrical bending of the shorting bar 40.

Figure 8:
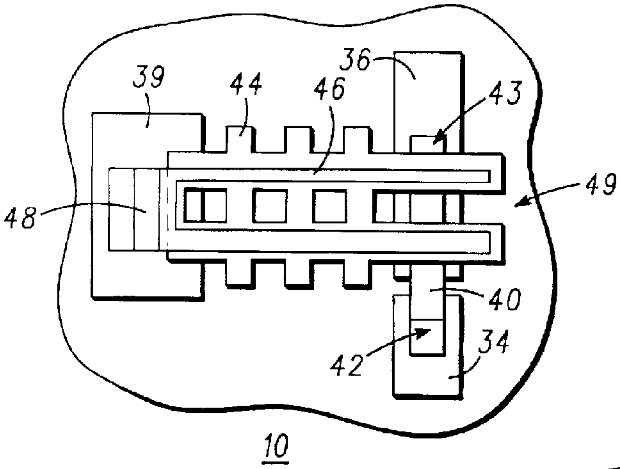
FIG. 8 illustrates a simplified top view of a micro-electro-mechanical device according to a fourth embodiment of the present invention.

FIG. 8 illustrates a top view of a fourth embodiment of the present invention. For ease of understanding, the same numerals are used for similar elements, despite their potentially dissimilar configurations. In this embodiment, top electrode 46 comprises less metal, or another electrically conductive material, and covers less area of cantilever structure 44, which comprises a two finger pattern, on the side of the electrically uncoupled portion 43 of shorting bar 40. The less metal of top electrode 46 provides for reduced electrostatic force on the side of the electrically uncoupled portion 43. The goal is also to compensate for the asymmetrical bending and improve contact quality.

Figure 9:
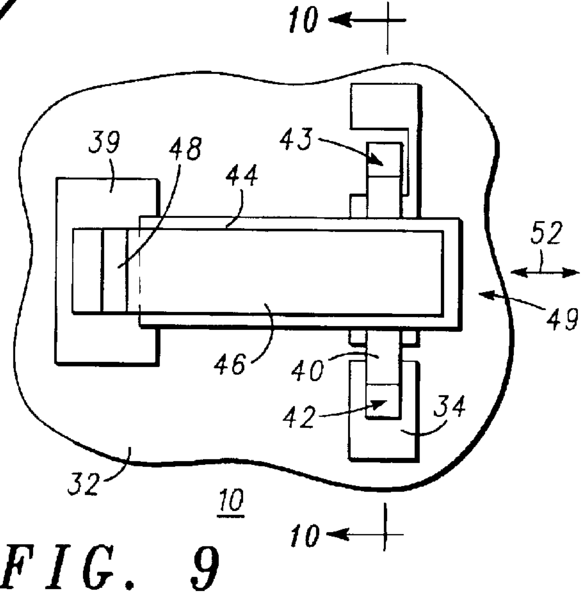
FIG. 9 illustrates a simplified top view of a micro-electro-mechanical device according to a fifth embodiment of the present invention.
Figure 10:
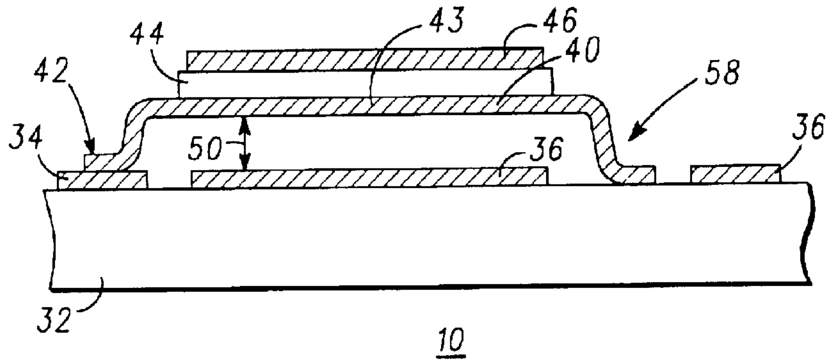
FIG. 10 illustrates a cross-sectional view of the micro-electro-mechanical device of FIG. 9, taken along a cross-sectional line 10—10 in FIG. 9.

Now with reference to both FIGS. 9 and 10, FIG. 9 illustrates a simplified top view of a fifth embodiment of the present invention, and FIG. 10 illustrates a cross-sectional view of micro-electro-mechanical device 10 of FIG. 9 taken along a cross-sectional line 10—10 in FIG. 9. For ease of understanding, the same numerals are used for similar elements, despite their potentially dissimilar configurations. In this embodiment, shorting bar 40 is fabricated to have a symmetrical design when viewed across a width of cantilever structure 44, shown by arrow 52 in FIG. 9 and as shown in FIG. 10, where a length of cantilever structure 44 is greater than the width and a thickness of cantilever structure 44. This symmetry is contrasted to the embodiments shown in FIGS. 1, 3, 5, 6, 7, and 8 in which shorting bar 40 is asymmetrical across the width of cantilever structure 44. In this embodiment, electrically coupled portion 42 is still fixed, and electrically uncoupled portion 43 is still moveable in a direction of arrow 50 (FIG. 10). Shorting bar 40, however, further comprises a third or fixed portion 58 (FIG. 10) permanently and physically connected or coupled to substrate 32 and is not moveable relative to substrate 32. Fixed portion 58 (FIG. 10) of shorting bar 40 is also an electrically uncoupled portion.

Figure 11:
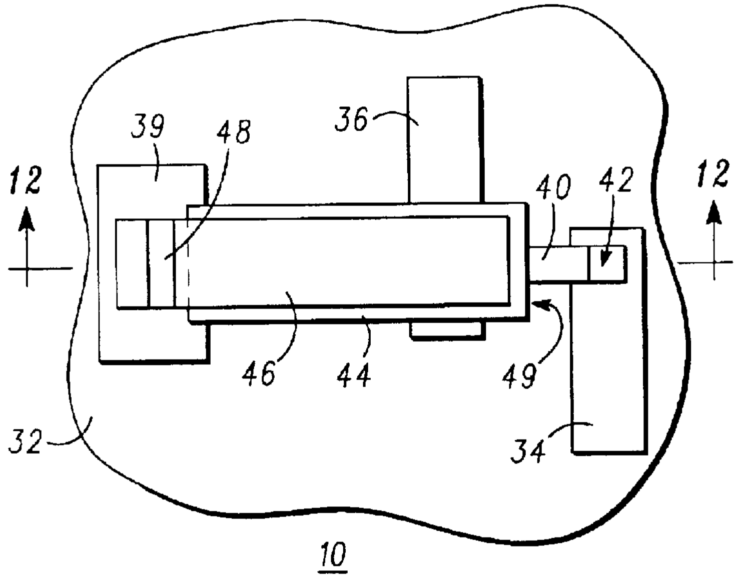
FIG. 11 illustrates a simplified top view of a micro-electro-mechanical device according to a sixth embodiment of the present invention.
Figure 12:
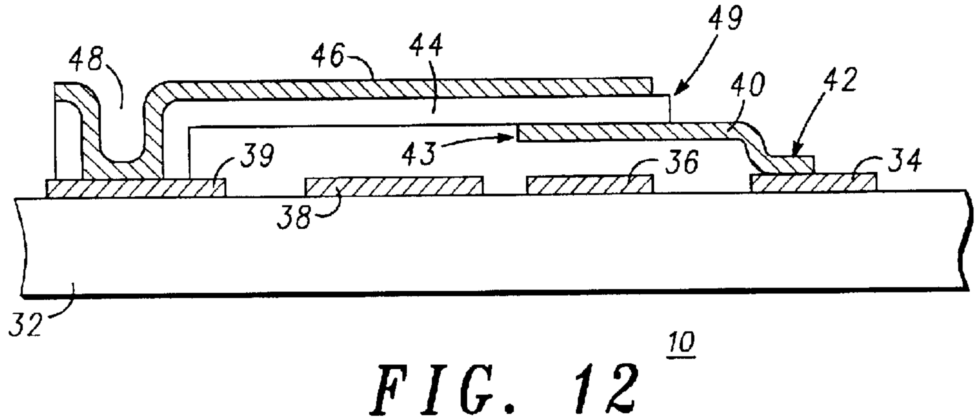
FIG. 12 illustrates a cross-sectional view of the micro-electro-mechanical device of FIG. 11, taken along a cross-sectional line 12—12 in FIG. 11.

Referring to FIGS. 11 and 12, FIG. 11 illustrates a simplified top view of a sixth embodiment of the present invention, and FIG. 12 illustrates a cross-sectional view of micro-electra-mechanical device 10 taken along a cross-sectional line 12—12 in FIG. 11. For ease of understanding, the same numerals are used for similar elements, despite their potentially dissimilar configurations. One end (in this embodiment, portion 43) of shorting bar 40 is formed underneath cantilever structure 44. Shorting bar 40 also extends, from electrically coupled portion 42 to electrically uncoupled portion 43, in a direction approximately parallel to the direction of cantilever structure 44.

In the embodiment of FIGS. 11 and 12, the electrically coupled portion 42 of the shorting bar 40 is also preferably permanently electrically coupled to first input/output signal line 34. Electrically uncoupled portion 43 of shorting bar 40 is formed underneath the end of the movable end, or end 49, of cantilever structure 44 and overlies second input/output signal line 36. In this embodiment, as in the other embodiments of the present invention, preferably only one portion, the electrically uncoupled portion 43, needs to be moved to be electrically coupled to second input/output signal line 36, while the other portion, electrically coupled portion 42, is preferably permanently electrically coupled to first input/output signal line 34. Also in this embodiment, shorting bar 40 is symmetrical about a length of cantilever structure 44, and a length of shorting bar 40 is substantially parallel to the length of cantilever structure 44.

By now it should be appreciated that structures and methods have been provided for improving the manufacturability of micro-electro-mechanical devices as well as for providing a micro-electro-mechanical device with improved electrical characteristics and better reliability. In particular, the aforementioned advantages are obtained by a shorting bar 40 that is electrically coupled to one first input/output signal line 34, preferably at all times during operation, so that electrical coupling preferably only needs to be made to the other second input/output signal line 36 during operation. Thus, a design and process for fabricating a micro-electro-mechanical device, which fully meets the advantages set forth above, has been provided.

Although the invention has been described with reference to specific embodiments, it will be understood by those skilled in the art that various changes may be made without departing from the spirit or scope of the invention. For instance, the numerous details set forth herein such as, for example, the material compositions are provided to facilitate the understanding of the invention and are not provided to limit the scope of the invention. Accordingly, the disclosure of embodiments of the invention is intended to be illustrative of the scope of the invention and is not intended to be limiting. It is intended that the scope of the invention shall be limited only to the extent required by the appended claims.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

What is claimed is:

1. A micro-electro-mechanical device comprising:

a substrate;

a first conductive layer over the substrate;

a second conductive layer over the substrate and separated from the first conductive layer;

a cantilever structure over the substrate, wherein the cantilever structure has a first end anchored to the substrate and a second end suspended over the substrate; and a shorting bar adjacent to the cantilever structure, wherein the shorting bar has a first portion and a second portion, wherein:

the first portion is anchored to and electrically coupled to the first conductive layer;

the second portion overlies and is removably electrically coupled to the second conductive layer; and the shorting bar does not comprise an insulating material.

2. The micro-electro-mechanical device of claim 1 wherein the cantilever structure has at least a two finger pattern.

3. A micro-electro-mechanical device comprising:

a substrate;

a first conductive layer over the substrate;

a second conductive layer over the substrate and separated from the first conductive layer;

a cantilever structure over the substrate, wherein the cantilever structure has a first end anchored to the substrate and a second end suspended over the substrate; and a shorting bar adjacent to the cantilever structure, wherein the shorting bar has a first portion and a second portion, and wherein the first portion is anchored to and electrically coupled to the first conductive layer and the second portion overlies and is removably electrically coupled to the second conductive layer, wherein the cantilever structure has less mass at a first side of the cantilever structure than at a second side of the cantilever structure, the first side of the cantilever structure closer to the first conductive layer than the second side of the cantilever structure.

4. A micro-electro-mechanical device comprising:

a substrate;

a first conductive layer over the substrate;

a second conductive layer over the substrate and separated from the first conductive layer;

a cantilever structure over the substrate, wherein the cantilever structure has a first end anchored to the substrate and a second end suspended over the substrate; and a shorting bar adjacent to the cantilever structure, wherein the shorting bar has a first portion and a second portion, and wherein the first portion is anchored to and electrically coupled to the first conductive layer and the second portion overlies and is removably electrically coupled to the second conductive layer; and a third conductive layer over the cantilever structure and covering more area at a first side of the cantilever structure than at a second side of the cantilever structure, the first side of the cantilever structure closer to the first conductive layer than the second side of the cantilever structure.

5. A micro-electro-mechanical device comprising:

a substrate;

a first conductive layer over the substrate;

a second conductive layer over the substrate and separated from the first conductive layer;

a cantilever structure over the substrate, wherein the cantilever structure has a first end anchored to the substrate and a second end suspended over the substrate; and a shorting bar adjacent to the cantilever structure wherein the shorting bar has a first portion and a second portion, and wherein the first portion is anchored to and electrically coupled to the first conductive layer and the second portion overlies and is removably electrically coupled to the second conductive layer, wherein the cantilever structure has first and second fingers over the second conductive layer, the first finger closer to the first conductive layer than the second finger and narrower than the second finger.

6. A micro-electro-mechanical device comprising:

a substrate;

a first conductive layer over the substrate:

a second conductive layer over the substrate and separated from the first conductive layer;

a cantilever structure over the substrate, wherein the cantilever structure has a first end anchored to the substrate and a second end suspended over the substrate; and a shorting bar adjacent to the cantilever structure, wherein the shorting bar has a first portion and a second portion, and wherein the first portion is anchored to and electrically coupled to the first conductive layer and the second portion overlies and is removably electrically coupled to the second conductive layer, wherein the cantilever structure has less mass at a first side of the cantilever structure than at a second side of the cantilever structure, the first side closer to the first conductive layer than the second side.

7. A micro-electro-mechanical device comprising:

a substrate;

a first conductive layer over the substrate;

a second conductive layer over the substrate and separated from the first conductive layer;

a cantilever structure over the substrate, wherein the cantilever structure has a first end anchored to the substrate and a second end suspended over the substrate; and a shorting bar adjacent to the cantilever structure, wherein the shorting bar has a first portion and a second portion, and wherein the first portion is anchored to and electrically coupled to the first conductive layer and the second portion overlies and is removably electrically coupled to the second conductive layer, wherein a third portion of shorting bar is anchored to the substrate, the second portion of the shorting bar located between the first and third portions of the shorting bar.

8. The micro-electro-mechanical device of claim 1 wherein the shorting bar is symmetrical across a width of the cantilever structure.

9. A micro-electro-mechanical device comprising:

a substrate;

a first conductive layer over the substrate;

a second conductive layer over the substrate and separated from the first conductive layer;

a cantilever structure over the substrate, wherein the cantilever structure has a first end anchored to the substrate and a second end suspended over the substrate; and a shorting bar adjacent to the cantilever structure, wherein the shorting bar has a first portion and a second portion, and wherein the first portion is anchored to and electrically coupled to the first conductive layer and the second portion overlies and is removably electrically coupled to the second conductive layer, wherein the shorting bar is asymmetric across a width of the cantilever structure.

10. The micro-electro-mechanical device of claim 1 wherein the shorting bar assists in suspending the second end of the cantilever structure over the substrate.

11. The micro-electra-mechanical device of claim 1 wherein the cantilever structure has a length substantially parallel to a length of the shorting bar.

12. The micro-electro-mechanical device of claim 1 wherein the shorting bar extends in a direction approximately parallel to a direction of the cantilever structure, where the direction of the cantilever structure is measured between the first end and the second end of the cantilever structure.

13. The micro-electro-mechanical device of claim 1 wherein the shorting bar extends in a direction approximately 90 degrees from a direction of the cantilever structure, where the direction of the cantilever structure is measured between the first end and the second end of the cantilever structure.

* * * * *